US009471113B2

(12) United States Patent
Fan et al.

(10) Patent No.: US 9,471,113 B2
(45) Date of Patent: Oct. 18, 2016

(54) SECURING STRUCTURE FOR EXPANSION CARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Yong-Chang Fan, Wuhan (CN); San-Yong Yang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 40 days.

(21) Appl. No.: 14/543,621

(22) Filed: Nov. 17, 2014

(65) Prior Publication Data

US 2016/0109910 A1 Apr. 21, 2016

(30) Foreign Application Priority Data

Oct. 15, 2014 (CN) .......................... 2014 1 0544176

(51) Int. Cl.
*H05K 7/12* (2006.01)
*G06F 1/18* (2006.01)

(52) U.S. Cl.
CPC ............... *G06F 1/185* (2013.01); *G06F 1/186* (2013.01)

(58) Field of Classification Search
USPC ........ 248/166, 462; 361/752, 755, 756, 759; 312/223.2
See application file for complete search history.

(56) References Cited

U.S. PATENT DOCUMENTS 3,958,786 A * 5/1976 Mann ..................... F16M 13/00 211/195
5,211,568 A * 5/1993 Yamada ............. H01R 12/7005 439/153
5,542,854 A * 8/1996 Bowen ............... H01R 12/7005 439/157
5,914,854 A * 6/1999 Holt ........................ G06F 1/184 361/679.23
6,276,950 B1 * 8/2001 Yodogawa ......... H01R 12/7005 439/160
6,368,126 B1 * 4/2002 Lee ...................... H05K 7/1409 439/160
6,702,598 B1 * 3/2004 Lo ...................... H01R 12/7005 439/157
8,562,036 B2 * 10/2013 Zhou ................... H01M 2/1061 292/256
8,665,587 B2 * 3/2014 Peng ....................... G06F 1/185 361/679.31
8,971,052 B2 * 3/2015 Fu ........................... G06F 1/185 361/679.32
2003/0137811 A1 * 7/2003 Ling .................... H05K 7/1431 361/759
2005/0148228 A1 * 7/2005 Jing ..................... H05K 7/1408 439/325
2008/0259582 A1 * 10/2008 Cheng ..................... G06F 1/185 361/801
2012/0287590 A1 * 11/2012 Zhang ............. H01R 13/62994 361/784

* cited by examiner

*Primary Examiner* — Steven Marsh
(74) *Attorney, Agent, or Firm* — Zhigang Ma

(57) ABSTRACT

A securing structure includes a base, a support member, a linking member, and a lock. The support member pivots and attaches to the base. The linking member pivots and is coupled to the support member and is slidably coupled to the base. The support member is configured to position in an original position, received in the base or in a working position, extending from the base. The linking member is configured to support the support member located in the working position. The lock is slidably attached to the support member. When the support member is positioned in the working position, the lock is configured to secure an object.

16 Claims, 5 Drawing Sheets

14
V
12
38
36
34
326
20
10

SECURING STRUCTURE FOR EXPANSION CARD

FIELD

The subject matter herein generally relates to a securing structure for an expansion card.

BACKGROUND

A variety of expansion cards, such as sound cards and peripheral component interconnect (PCI) cards, are widely used in electronic devices. As performance of expansion cards increase, the sizes of expansion cards increase as well.

BRIEF DESCRIPTION OF THE DRAWINGS

Implementations of the present technology will now be described, by way of example only, with reference to the attached figures.

DETAILED DESCRIPTION

Figure 1:
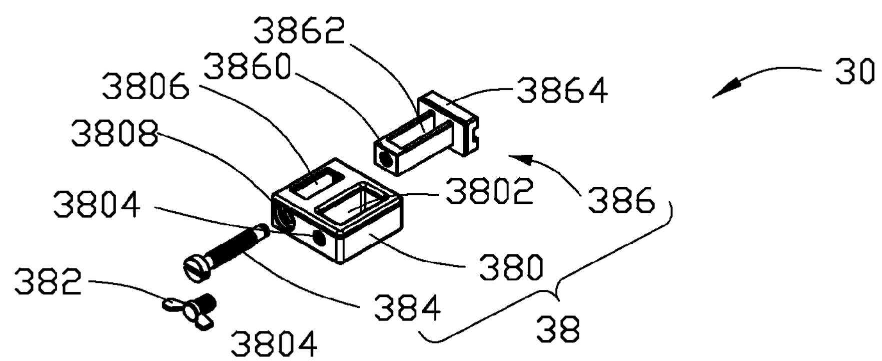
FIG. 1 is an exploded isometric view of an embodiment of a securing structure.
Figure 1:
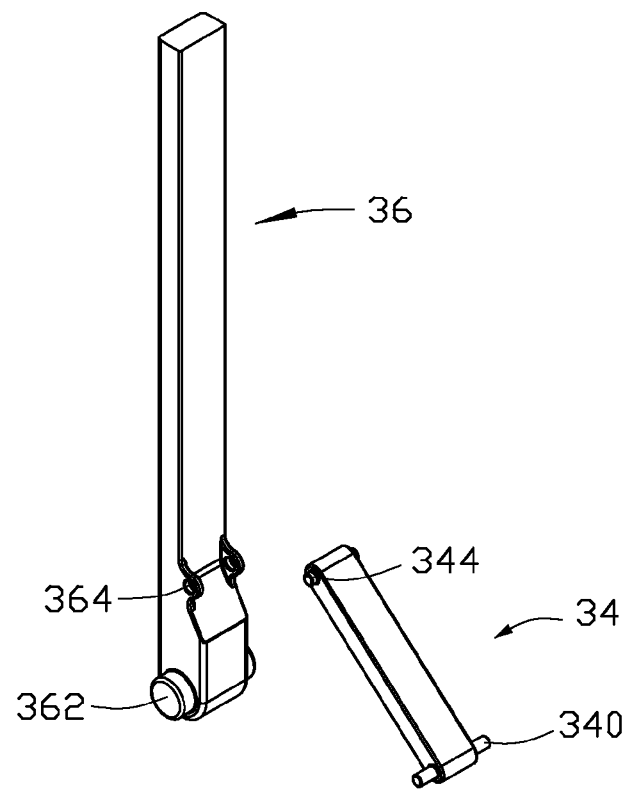
Figure 1:
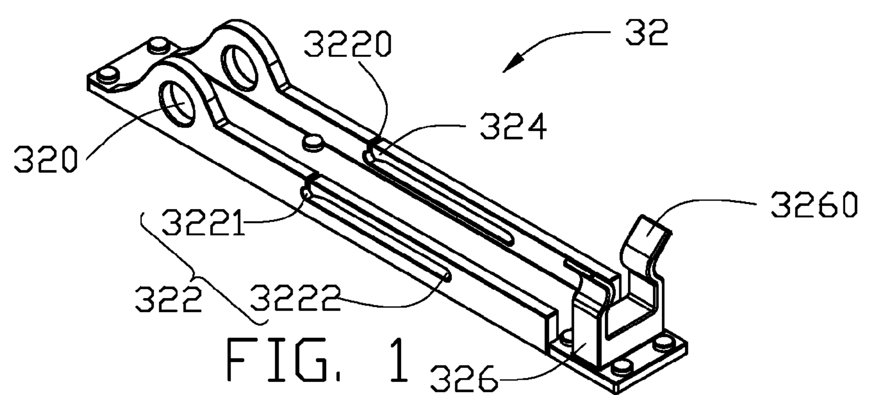

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a securing structure. The securing structure includes a base, a support member, a linking member, and a lock. The support member pivots and is attached to the base. The linking member pivots and is coupled to the support member and is slidable to the base. The support member is configured to be positioned at an original position received in the base or at a working position extending from the base. The linking member is configured to support the support member in the working position. The lock is slidably attached to the support member. When the support member is in the working position, the lock is configured to secure an object.

FIG. 1 illustrates a securing structure 30 for securing an object. The securing structure 30 includes a base 32, a support member 36, a linking member 34, and a lock 38. The object can be an expansion card (see FIG. 3), such as sound cards and peripheral component interconnect (PCI) cards.

The base 32 is configured to couple the securing structure 30 to equipment. In at least one embodiment, the equipment can be an enclosure 10 (see FIG. 3). Two pivot holes 320 are defined in one side of the base 32 for pivoting and coupling the support member 36. The pivot holes 320 are aligned with each other. A clamp 326 extends from an opposite side of the base 32. Two clamp pieces 3260 extend from the clamp 326 for clamping the support member 36. Two slots 322, each defining an entrance 3220 at a first end, are defined in the base 32 slidably coupling the linking member 34 to the base 32. A resisting protrusion 324 is deformable and located at the first end of each slot 322 and configured to prevent the linking member 34 from sliding. A distance between each pivot hole 320 and each first end 3221 of each slot 322 is less than a distance between each pivot hole 320 and an opposite second end 3222 of each slot 322.

Two sliding posts 340 extend from one end of the linking member 34 and protrude from opposite sides of the linking member 34. Each sliding post 340 is engaged with and is configured to slide along each slot 322. The resisting protrusions 324 can be pushed by the sliding posts 340 and deform, thereby the sliding posts 340 are allowed to slide along the slots 320 freely. Two linking posts 344 extend from opposite ends of the linking member 34 and protrude from opposite sides of the linking member 34.

The support member 36 includes two pivot posts 362 corresponding to the pivot holes 320. The pivot posts 362 extend from opposite sides of the support member 36. Two linking holes 364 are defined in the support member 36, the linking holes 364 receive the linking posts 344 allowing the linking posts 344 to pivot.

The lock 38 includes a sliding member 380, an operation member 384, and a catch member 386. The sliding member 380 includes an accommodating portion 3806 for accommodating the catch member 3860. An operation hole 3808 is defined in the sliding member 380 communicating with the accommodating portion 3806. The operation member 384 extends into the accommodating portion 3806 via the operation hole 3808. In at least one embodiment, the operation hole 3808 is a screw hole, and the operation member 384 is a screw threadedly attaching to the sliding member 380. A sliding hole 3802 is defined in the sliding member 380 corresponding to the support member 36. An axial direction of the sliding hole 3802 is substantially perpendicular to an axial direction of the operation hole 3808. A positioning hole 3804 is defined in the sliding member 380 communicating with the sliding hole 3802. The catch member 386 includes a connecting portion 3862 and a head portion 3864. The connecting portion 3862 is configured to fit into the accommodating portion 3806. The head portion 3864 is configured to catch the object such as the expansion card (see FIG. 3). A catch recess 38640 is defined in the head portion 3864 clamping the object. In at least one embodiment, the object is an expansion card 20 attached to the enclosure 10 (see FIG. 3). In another embodiment, the head portion 3864 is deformable. A through hole 3860 is defined in the connection portion 3862. The operation member 384 is coupled to the connecting portion 3862 via the through hole 3860.

The securing structure 30 further includes a positioning member 382. The positioning member 382 is coupled to the sliding member 380 via the positioning hole 3804. A distal end of the positioning member 382 can pass through the positioning hole 3804 and resists the support member 36 preventing the lock 38 from sliding. In at least one embodiment, the positioning hole 3804 is a screw hole, and the positioning member 382 is a screw, thereby the positioning member 382 is threadedly engaged with the positioning hole 3804.

Figure 2:
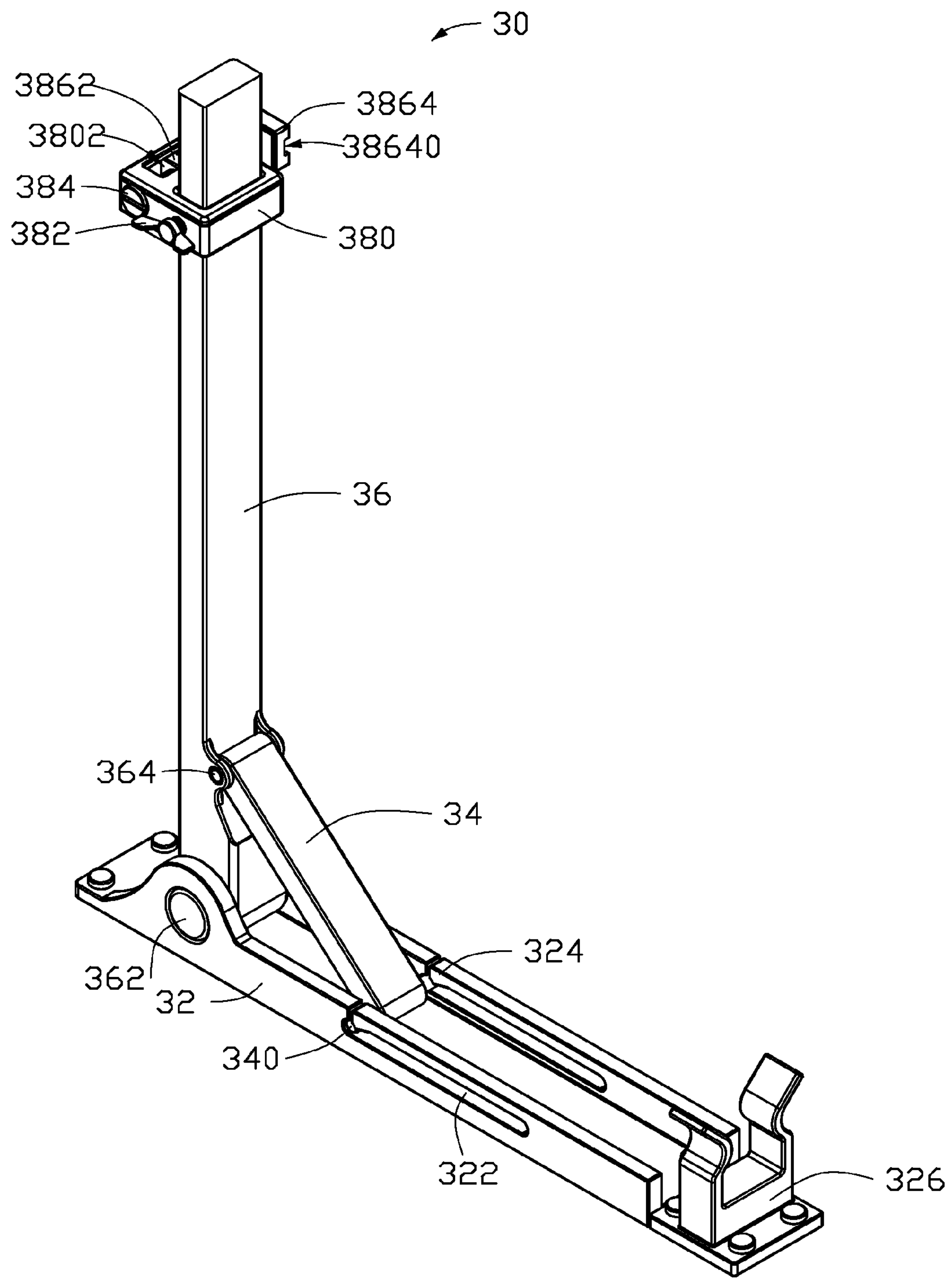
FIG. 2 is an assembled isometric view of the securing structure in FIG. 1.

FIG. 2 illustrates an assembly of the securing structure 30. The pivot posts 362 of the support member 36 are engaged with the pivot holes 320, thereby the support member 36 pivots and is attached to the base 32. The support member 36 is configured to be positioned in an original position (see FIG. 3) received in the base 32 or in a working position extending from the base 32. The support member 36 is substantially perpendicular to the base 32 when being positioned in the working position.

The linking posts 344 are engaged with the linking holes 364 with one end of the linking member 34 pivoting and coupling to the support member 36. The sliding posts 340 are engaged with the slots 322 of the base 32, thereby another end of the linking member 34 is slidable and secured to the base 32. The support member 36 is rotatable relative to the base 32 for allowing the linking member 34 to be moveable relative to the base 32; thereby the supporting member 36 extends from the base 32 for allowing the lock 38 to secure the object. When the support member 36 is rotated relative to the base 32, the linking posts 340 slide and rotate relative to the base 32, and the sliding posts 344 of the linking member 34 are rotated relative to the support member 36. When the support member 36 is rotated relative to the base 32 and positioned in the working position, the linking posts 340 are slid into position at the first ends 3221 of the slots 322. The linking member 34 is located at a second position inclined relative to both the support member 36 and the base 32. The resisting protrusions 324 resist the sliding posts 340 from sliding along the slots 322, thereby the linking member 34 supports the support member 36 in the working position. When the support member 36 is rotated to be in the original position, the linking posts 340 slide to the second ends 3222 of the slots 322. The linking member 34 is located at a first position in the base 32 (see FIG. 3) parallel to the support member 36.

The support member 36 passes through the sliding hole 3802; thereby the sliding member 380 is slidably attached to the support member 36. The sliding member 380 is configured to slide along a first direction substantially parallel to the lengthwise axial direction of the support member 36. The positioning member 382 is engaged with the positioning hole 3804 thereby preventing the sliding member 380 from sliding. When the operation member 384 is rotated, the operation member 384 is slidable relative to the sliding member 380 along a second direction substantially perpendicular to the lengthwise axial direction of the support member 36. The catch member 386 is slidably secured to the sliding member 380 by the operation member 384. The catch member 386 is configured to slide along the second direction based on movement of the operation member 384. When the support member 36 is positioned in the working position, the lock 38 is configured to secure the object.

Figure 3:
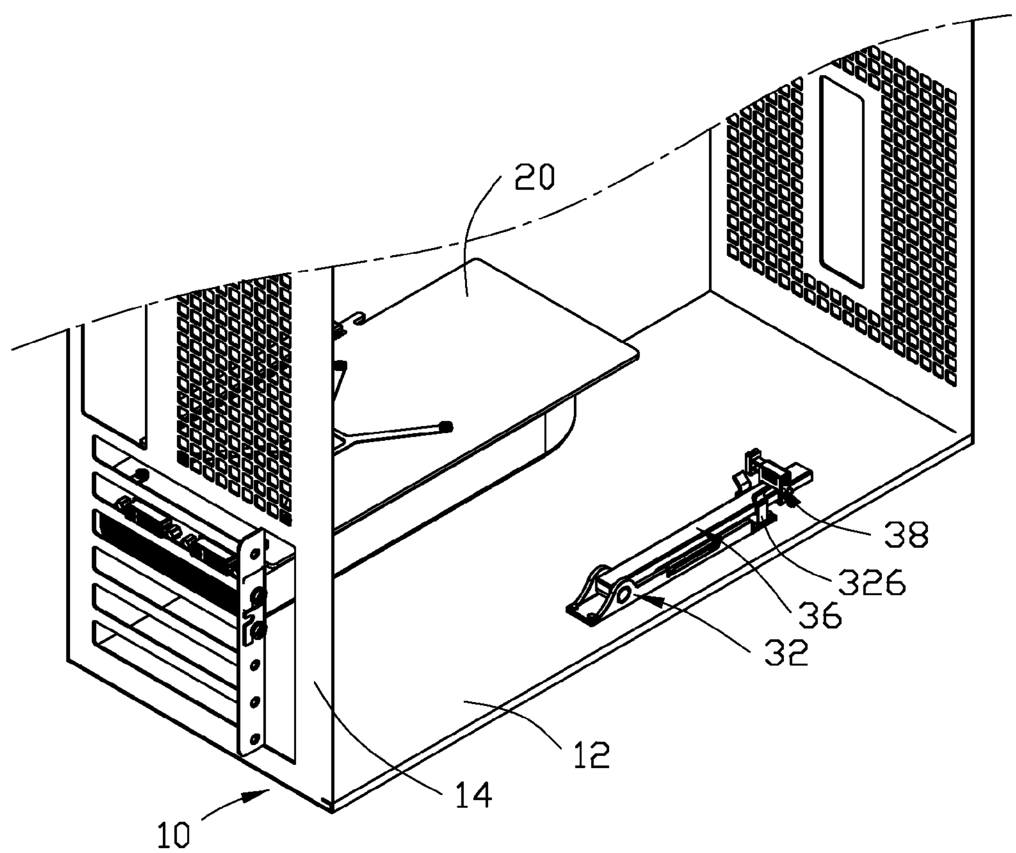
FIG. 3 is a partial isometric view of the securing structure in use, the securing structure is used in an enclosure with a PCI card.

FIG. 3 illustrates when in use, the securing structure 30 is assembled in an enclosure 10 for securing an expansion card 20. In at least one embodiment, the enclosure 10 is an electronic device enclosure, and the expansion card 20 is a PCI card. The enclosure 10 includes a bottom plate 12 and a side plate 14 substantially perpendicular to the bottom plate 12. The expansion card 20 is attached to the side plate 14 and substantially parallel to the bottom plate 12. The base 32 is coupled to the bottom plate 12 to attach the securing structure 30 to the enclosure 10. The support member 36 is located in the original position, and the linking member 34 is located at the first position. The expansion card 20 is disengaged from the lock 38.

Figure 4:
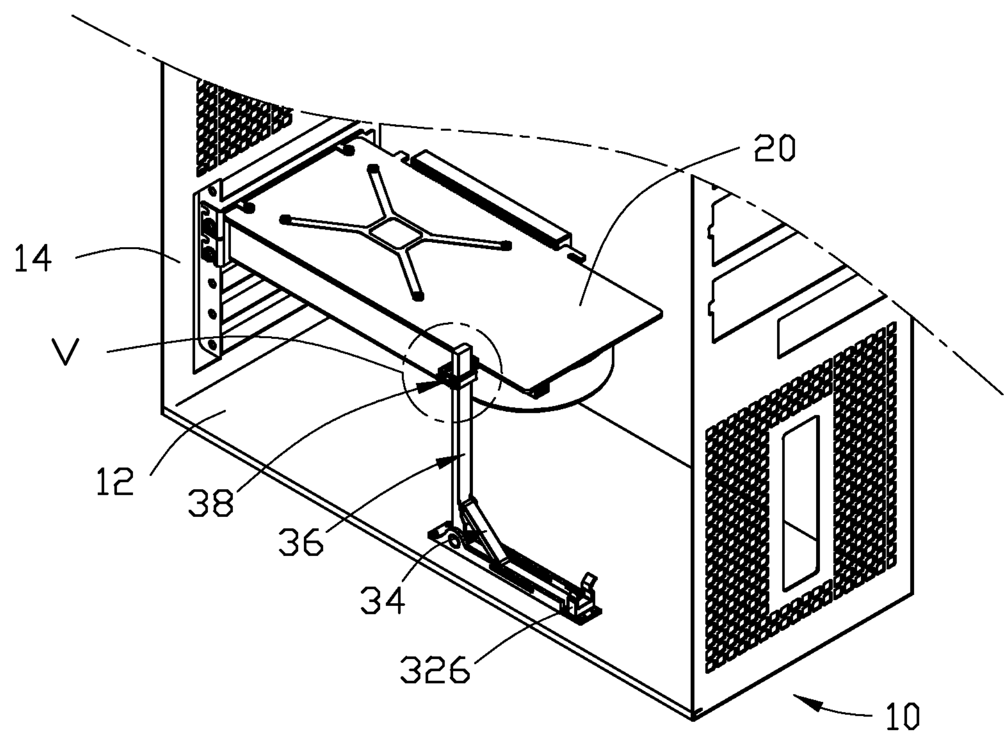
FIG. 4 is an isometric view of the securing structure of FIG. 3 in use, from another angle and illustrating the support member in a working position.
Figure 5:
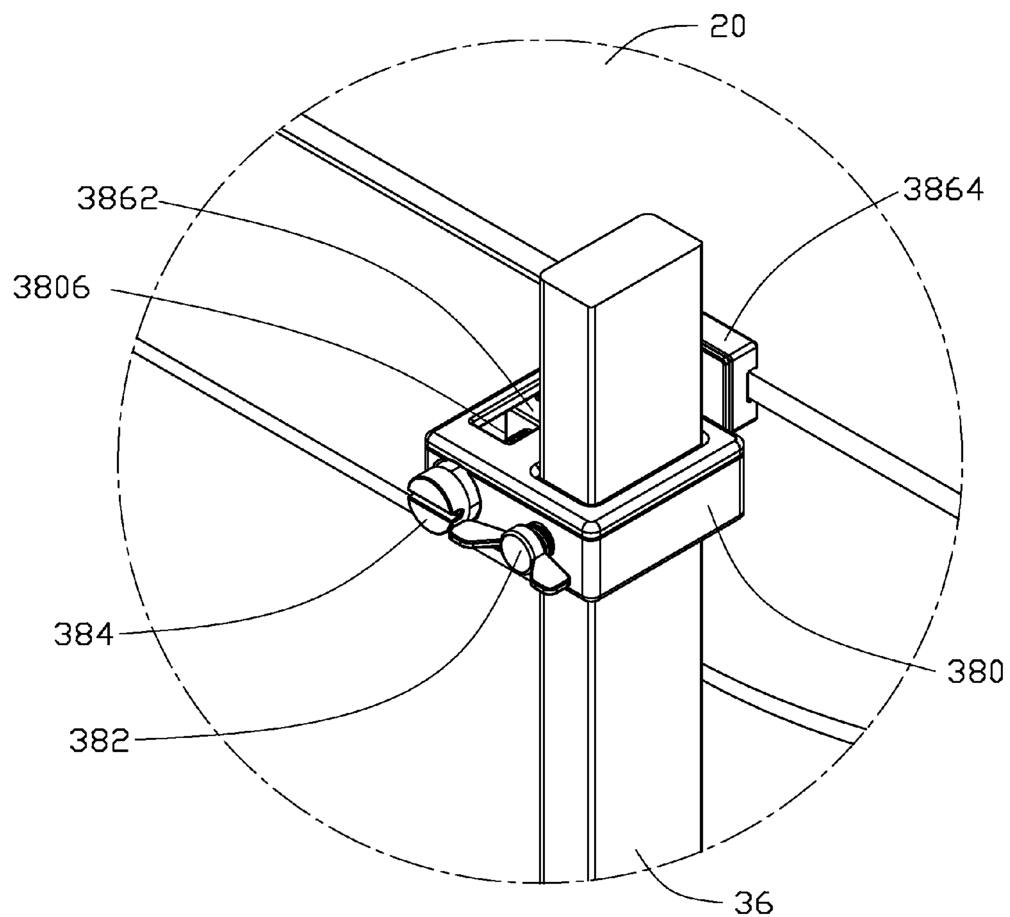
FIG. 5 is an enlarged isometric view of circle portion V of FIG. 4.

FIGS. 4-5 illustrate that the support member 36 is located in the working position, and the linking member 34 is located in a second position. The support member 36 is substantially perpendicular to the bottom plate 12, and the linking member 34 is substantially inclined to the bottom plate 12. The sliding member 380 is slid to a position where the catch recess 38640 is aligned to an edge of the expansion card 20. The operation member 384 is rotated until the catch member 386 is located in a position where the head portion 3864 abuts the expansion card 20 and the edge of the expansion card 20 is griped in the catch recess 38640. Thereby, the expansion card 20 is secured by the securing structure 30 and attaches firmly to the side plate 14.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A securing structure comprising:

a base;

a support member pivotably attached to the base and configured to be in an original position received in the base or in a working position extending from the base;

a linking member configured to support the support member in the working position and pivotably coupled to the support member and slidably coupled to the base; and a lock slidably attached to the support member;

wherein when the support member is in the original position, the linking member is located at a first position in which the linking member is received in the base; and when the support member is positioned at the working position, the linking member is located at a second position in which the linking member is inclined relative to the base; the lock is configured to secure an object, the lock is slidable along a first direction that is substantially parallel to the lengthwise axial direction of the support member, the lock comprises a catch member for catching the object, and the catch member is slidable along a second direction that is substantially perpendicular to the lengthwise axial direction of the support member.

2. The securing structure of claim 1, wherein the lock further comprises a sliding member slidably attached to the support member and an operation member pivotably attached to the sliding member.

3. The securing structure of claim 2, wherein the operation member is slidably relative to the sliding member along the second direction.

4. The securing structure of claim 2, wherein the catch member is coupled to the sliding member by the operation member and is configured to be slid by the operation member.

5. The securing structure of claim 1, further comprising a positioning member pivotably coupled to the lock and configured to prevent the lock from sliding.

6. The securing structure of claim 5, wherein a positioning hole is defined in the lock, and the positioning member is configured to pass through the positioning hole and resist the support member.

7. The securing structure of claim 1, wherein a slot is defined in the base, and a sliding post extends from the linking member and is engaged with the slot; the sliding post is configured to slide along the slot.

8. The securing structure of claim 7, wherein a resisting protrusion is deformable located at a first end of the slot and configured to prevent the linking member from sliding.

9. A securing structure comprising:

a base;

a support member pivotably received in the base;

a linking member pivotably coupled to the support member and slidably coupled to the base; and a lock slidably attached to the support member;

wherein the support member is rotatable relative to the base for allowing the linking member to be moveable relative to the base, thereby the supporting member extends from the base for allowing the lock to secure an object, the lock is slidable along a first direction that is substantially parallel to the lengthwise axial direction of the support member, the lock comprises a catch member for catching the object, the catch member is slidable along a second direction that is substantially perpendicular to the lengthwise axial direction of the support member.

10. The securing structure of claim 9, wherein a slot is defined in the base, and a sliding post extends from the linking member and is engaged with the slot; the sliding post is configured to slide along the slot.

11. The securing structure of claim 10, wherein a resisting protrusion is deformable located at a first end of the slot and configured to prevent the linking member from sliding.

12. The securing structure of claim 11, wherein the base comprises a pivot hole for coupling the support member, and a distance between the pivot hole and the first end is less than a distance between the pivot hole and an opposite second end of the slot.

13. The securing structure of claim 9, wherein when the support member is positioned at the original position, the linking member is parallel to the support member; and when the support member is positioned at the working position, the linking member is inclined relative to the support member.

14. The securing structure of claim 9, wherein the lock further comprises a sliding member slidably attached to the support member and an operation member pivotably attached to the sliding member.

15. The securing structure of claim 14, wherein the catch member is coupled to the sliding member by the operation member and is configured to be slid by the operation member.

16. The securing structure of claim 9, further comprising a positioning member coupled to the lock and configured to prevent the lock from sliding.

* * * * *